United States Patent [19]

Jerome et al.

[11] Patent Number: 5,561,073

[45] Date of Patent: Oct. 1, 1996

[54] METHOD OF FABRICATING AN ISOLATION TRENCH FOR ANALOG BIPOLAR DEVICES IN HARSH ENVIRONMENTS

[76] Inventors: Rick C. Jerome, 17630 Caribou Dr., Monument, Colo. 80132; Ian R. C. Post, 3475 Knoll La., Apt. 205, Colorado Springs, Colo. 80917

[21] Appl. No.: 226,804

[22] Filed: Apr. 12, 1994

Related U.S. Application Data

[63] Continuation-in-part of Ser. No. 72,653, Jun. 3, 1993, Pat. No. 5,344,785, which is a continuation-in-part of Ser. No. 850,612, Mar. 13, 1992, abandoned, which is a continuation of Ser. No. 673,817, Mar. 22, 1991, abandoned.

[51] Int. Cl.$^6$ ............................................. H01L 21/265
[52] U.S. Cl. ..................... 437/31; 437/61; 437/62; 437/67
[58] Field of Search ........................... 437/62, 67, 31, 437/236, 235, 247, 61

[56] References Cited

U.S. PATENT DOCUMENTS

| | | | |
|---|---|---|---|
| 4,631,803 | 12/1986 | Hunter et al. | 29/576 W |
| 4,663,832 | 5/1987 | Jambotkar | 437/236 |
| 4,810,667 | 3/1989 | Zorinsky et al. | 437/67 |
| 4,835,115 | 5/1989 | Eklund | 437/38 |
| 4,963,505 | 10/1990 | Fujii et al. | 437/62 |
| 5,084,408 | 1/1992 | Baba et al. | 437/62 |
| 5,196,373 | 3/1993 | Beasom | 437/62 |
| 5,258,318 | 11/1993 | Buti et al. | 437/62 |
| 5,270,265 | 12/1993 | Hemmenway et al. | 437/67 |
| 5,352,625 | 10/1994 | Hoshi | 437/62 |
| 5,376,560 | 12/1994 | Aronowitz et al. | 437/67 |

FOREIGN PATENT DOCUMENTS

| | | | |
|---|---|---|---|
| 0232748 | 8/1987 | European Pat. Off. | 437/67 |
| 0049643 | 4/1987 | Japan | 437/67 |

OTHER PUBLICATIONS

"The Effect of Trench Processing Conditions on Complementary Bipolar Analog Devices with SOI/Trench Isolation", By R. Jerome et al., 1993 IEEE, pp. 41–44.

*Primary Examiner*—Tuan H. Nguyen

[57] ABSTRACT

The present invention teaches a method of making an isolation trench. First, a silicon on insulator ("SOI") structure is provided having a conductive layer superjacent the insulator of the SOI. Second, a trench is formed down to the insulator of the SOI, thereby creating a first and second conductive region. Third, a first silicon dioxide layer is formed conformally with the sidewalls of the first and second conductive region. Fourth, a second silicon dioxide layer is formed conformally and superjacent the first silicon dioxide layer. Fifth, the remaining areas unfilled in the trench are filled with an undoped polysilicon filling. Sixth, the polysilicon layer is planarized. Seventh, an oxide cap is formed on top of the polysilicon refill. Eight, an isolation mask is formed, and the active area openings within the structure are etched down to the single crystal silicon.

10 Claims, 4 Drawing Sheets

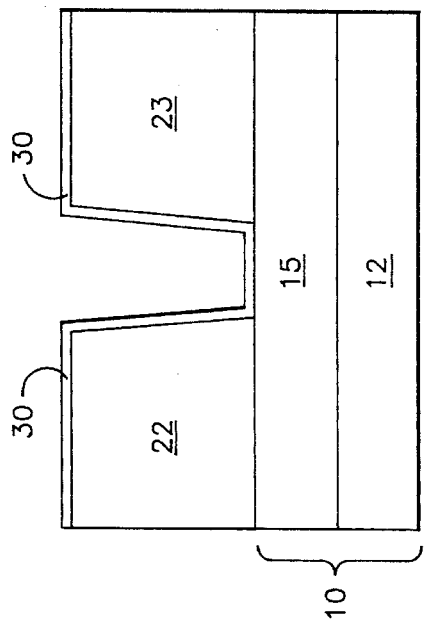
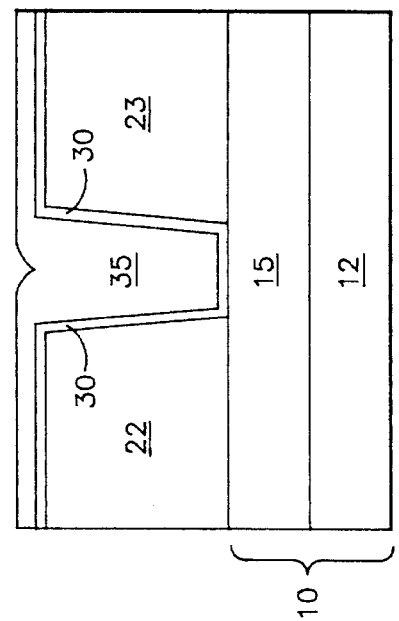
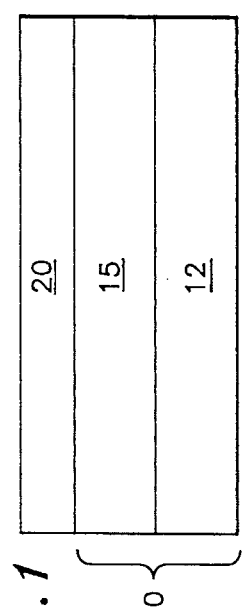
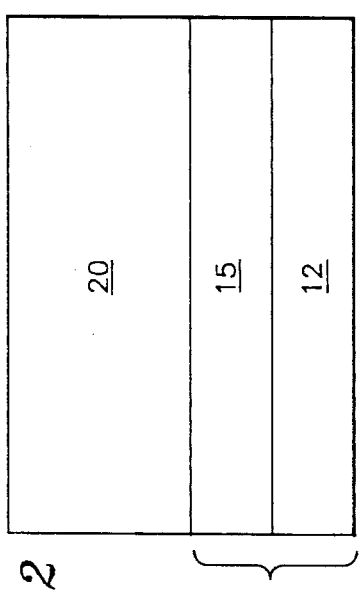
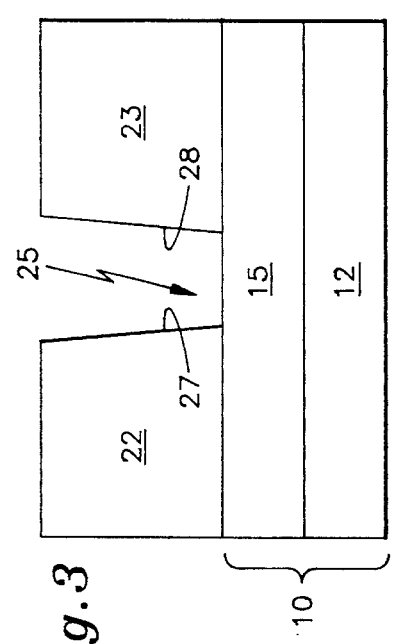

METHOD OF FABRICATING AN ISOLATION TRENCH FOR ANALOG BIPOLAR DEVICES IN HARSH ENVIRONMENTS

RELATED APPLICATIONS

This is a continuation-in-part of application Ser. No. 08/072,653 filed Jun. 3, 1993 and issued Sept. 6, 1994 as U.S. Pat. No. 5,344,785, which is a continuation-in-part of Ser. No. 07/850,612 filed Mar. 13, 1992, now abandoned, which is a continuation of Ser. No. 673,817 filed Mar. 22, 1991, now abandoned.

TECHNICAL FIELD

This invention relates to the field of semiconductors, and more particularly to an isolation trench for analog bipolar devices in harsh environments.

BACKGROUND ART

Several techniques are known in the semiconductor industry for providing isolation between transistors. One such method employs an anisotropic etch of a silicon crystal having a <100> orientation. The etched surface is oxidized and deposited with a thick layer of polysilicon to form islands of single crystal silicon. Subsequently, the wafer is inverted, polished and etched back to expose the silicon islands in which the transistors are formed. Problems associated with this technology are grind and etch-back non-uniformity, limited wafer diameter, large device size, device size dependence on isolation depths, and high parasitic AC impedance with polysilicon substrates.

Several other methods exist for transistor isolation. However, these approaches include PN junction isolation and Local Oxidation of Silicon ("LOCOS") isolation. As these isolation methods are designed for bulk silicon material, they are all subject to parasitic interaction with the substrate.

Still a further method for providing dielectric isolation uses a trench implementation filled with a dielectric material. In FIG. 1 of U.S. Pat. No. 4,631,803, a known trench structure is shown. The trench structure illustrated is intended to minimize stress at the interface between the trench and the semiconductor substrate by curving the bottom of the trench.

Moreover, in FIGS. 2 and 3 of U.S. Pat. No. 4,631,803, a trench structure is illustrated. Here, the inventor teaches the formation of a trench directly on a semiconductor substrate. The trench is filled with a silicon dioxide layer 38, followed by a first silicon nitride layer 40, followed by a refill 42 of either undoped polysilicon or silicon oxide. In FIG. 3, a second silicon nitride layer 48 is also employed.

There are several disadvantages to the trench structure of disclosed and illustrated in FIGS. 2 and 3 of U.S. Pat. No. 4,631,803. Firstly, silicon nitride is a brittle film with a high value of intrinsic stress. Further, silicon nitride has a different rate of thermal expansion than silicon, silicon dioxide, as well as polysilicon. As such, the trench arrangement of FIGS. 2 and 3 is prone to defects and generations of dislocations in silicon due to the stress associated with the silicon nitride layer(s).

Moreover, silicon nitride has a higher dielectric constant in comparison with silicon dioxide. Given the potential for parasitic capacitance by the formation of the trench structure, a higher resultant parasitic capacitance value is created.

Furthermore, the teachings of the trench arrangement of FIGS. 2 and 3 also fail to provide a radiation hardened trench substantially immune to flicker noise. This is because the trench structures of FIGS. 1, 2 and 3 are contained in a bulk silicon semiconductor substrate. This allows for PN junction latch-up problems with the substrate under harsh environments, such as, for example, high voltage, high temperature and radiation environments.

In light of the limitations of these known isolation trench designs, a need exists for an isolation trench which is radiation hardened and substantially immune to flicker noise. Further, the semiconductor industry requires an isolation trench which minimizes stress and defect generation in silicon. Further, an isolation trench on an SOI substrate is needed to provide a means for intrinsic gettering on a semiconductor substrate. Complete dielectric isolation is also in demand to minimize noise and latch-up effects under harsh environments. Furthermore, an isolation trench is required which has improved stress related characteristics, and substantially reduced dislocation generation. Additionally, there is a need in the semiconductor industry for an isolation trench having a substantially lower parasitic capacitance and resistance.

DISCLOSURE OF THE INVENTION

The primary advantage of the present invention is to provide an isolation trench and a method of making the same which is radiation hardened and substantially immune to noise.

Another advantage of the present invention is to provide an isolation trench and a method of making the same which draws stress and defects to the interface between the trench and a dielectric layer of a silicon on insulator ("SOI") type substrate, thereby gettering defects away from the active device regions at the surface.

Yet another advantage of the present invention is to provide an isolation trench and a method of making the same which provides a means for intrinsic gettering for a semiconductor substrate.

Still a further advantage of the present invention is to provide an isolation trench and a method of making the same which has improved stress related characteristics, having substantially reduced dislocation generation.

Yet still another advantage of the present invention is to provide an isolation trench and a method of making the same having a substantially lower parasitic capacitance and resistance.

In order to achieve the advantages of the present invention, a method and structure are disclosed for making an isolation trench particularly advantageous in harsh environments, such as, for example, high voltage, high temperature and radiation environments. First, a silicon on insulator ("SOI") structure is provided having a conductive layer superjacent the insulator of the SOI. Second, a trench is formed down to the insulator of the SOI, preferably by means of an anisotropic etch step, thereby creating a first and second conductive region. Third, a first silicon dioxide layer is formed conformally with the sidewalls of the first and second conductive region created by the trench. Fourth, the trench is refilled with silicon dioxide, preferably comprising borophosphosilicate glass ("BPSG"). Fifth, an isolation mask is formed, and the active area openings within the structure are etched down to the single crystal silicon. Subsequently, bipolar devices can be realized by employing additional known fabrication steps.

In a further embodiment of the present invention, a method and structure are disclosed for making an isolation trench of particular benefit in harsh environments, such as, for example, high voltage, high temperature and radiation environments. First, a silicon on insulator ("SOI") structure is provided having a conductive layer superjacent the insulator of the SOI. Second, a trench is formed down to the insulator of the SOI, preferably by means of an anisotropic etch step, thereby creating a first and second conductive region. Third, a first silicon dioxide layer is formed conformally with the sidewalls of the first and second conductive region created by the trench. Fourth, a second silicon dioxide layer, preferably comprising BPSG, is formed conformally and superjacent the first silicon dioxide layer to fill a portion of the trench. Fifth, the remaining areas untilled in the trench are refilled with an undoped polysilicon. Sixth, an isolation mask is formed, and the active area openings within the structure are etched down to the single crystal silicon. Subsequently, bipolar devices can be realized by employing additional known fabrication steps.

In still another embodiment of the present invention employed in conjunction with filled trench structure of either the first or second embodiments, a method and structure are disclosed for making an isolation trench particularly advantageous in harsh environments, such as, for example, high voltage, high temperature and radiation environments. Here, a silicon dioxide pad is formed superjacent a trench refill, and a layer of polysilicon is formed superjacent the silicon dioxide pad. Next, an anisotropic etch is performed to create a residual polysilicon portion and a pair of polysilicon notches positioned over the silicon dioxide pad. Subsequently, a patterned silicon nitride layer is formed superjacent a portion of the silicon dioxide pad. Upon the forming the patterned silicon nitride layer, an isolation mask is formed, and the active area openings within the structure are etched down to the single crystal silicon. Once this etch down is complete, a local oxidation of silicon ("LOCOS") step is executed to form a silicon dioxide cover. This LOCOS step assists in converting the residual portion and the notches of polysilicon, as well as portions of both the conductive regions and the trench refill to silicon dioxide. Subsequently, bipolar devices can be realized by employing additional known fabrication steps.

BRIEF DESCRIPTION OF THE DRAWINGS

The present invention will be better understood from reading the following description of non-limited embodiments, with reference to the attached drawings, wherein below:

FIG. 1 illustrates a semiconductor structure according to a first step of a first embodiment of the present invention;

FIG. 2 illustrates a semiconductor structure according to a second step of a first embodiment of the present invention;

FIG. 3 illustrates a semiconductor structure according to a third step of a first embodiment of the present invention;

FIG. 4 illustrates a semiconductor structure according to a fourth step of a first embodiment of the present invention;

FIG. 5 illustrates a semiconductor structure according to a fifth step of a first embodiment of the present invention;

DETAILED DESCRIPTION OF THE INVENTION

Figure 8:
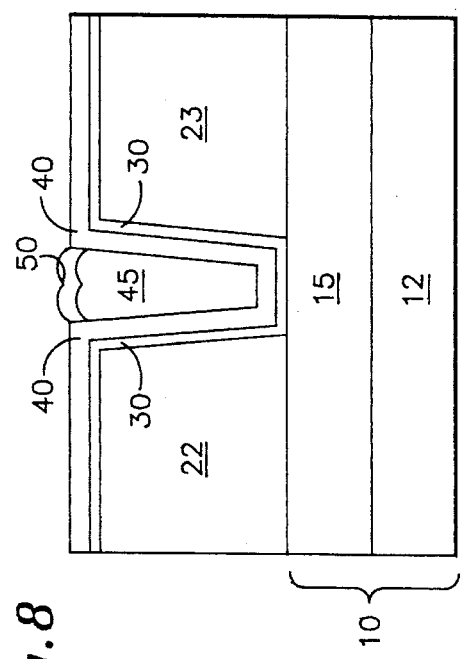
FIG. 8 illustrates a semiconductor structure according to a further step of the second embodiment of the present invention.

The steps of the present invention related to the construction of an isolation trench are illustrated in sequence of FIGS. 1 through 13. Each Figure illustrates the results of one or more steps in the method of the present invention, thereby reducing the number of Figures incorporated herein.

Referring to FIG. 1, a semiconductor structure 10 is depicted according to a first step of the present invention. Semiconductor 10 preferably comprises a stacked silicon on insulator ("SOI") type substrate. SOI substrates inherently comprise radiation hardened characteristics. Further, SOI substrates are substantially immune to noise. This is realized by the fact that SOI substrates provide greater isolation from the substrate instead of a PN junction, as well as reduced parasitic effects.

SOI substrate 10 comprises a semiconductor substrate 12 and a first dielectric layer 15 positioned superjacent substrate 12. First dielectric layer 15 also comprises a silicon dioxide layer having a thickness substantially in the range of 0.3 μm to 3 μm, though 1.0 μm is preferred.

Formed superjacent semiconductor structure 10 is a first conductive layer 20. In one embodiment of the present invention, layer 20 comprises superficial silicon. Layer 20 can also be formed independently. Furthermore, layer 20 can be implanted and annealed to form a heavily doped P or N type conductivity. In the preferred embodiment, layer 20 comprises a thickness of approximately 2 μm. However, the thickness of layer 20 can also be substantially in the range of 0.1 μm to 15 μm.

Referring to FIG. 2, semiconductor structure 10 is depicted according to a second step of the present invention. To increase its thickness, an epitaxial deposition step is performed on first conductive layer 20. Further, an additional implant of the same species may be executed to maintain the level of doping and the conductivity type of the epitaxial layer formed. The preferred resultant thickness of first conductive layer 20 by employing this step is approximately 6 μm. Nonetheless, this resultant thickness can be substantially in the range of 1 μm to 20 μm.

Referring to FIG. 3, semiconductor structure 10 is depicted according to a third step of the present invention. Upon completion of the epitaxial deposition, an isolation trench 25 is formed, thereby creating a first and second conductive region, 22 and 23, and a first and second sidewall, 27 and 28, from first conductive layer 20. It should be noted that within first and second conductive regions 22 and 23 a first semiconductor and second semiconductor device (not shown) such as complementary bipolar analog devices can be formed.

Isolation trench 25 is formed by performing an anisotropic dry etch step to maintain an angle substantially in the range of 85° and 90° between the sidewalls. In the preferred embodiment, however, the angle is approximately 87° between the sidewalls, 27 and 28, to optimize subsequent refilling steps. As such, the etchant etches through a predetermined region of first conductive layer 20, stopping at first dielectric layer 15. Thus, the total depth of isolation trench 25 is substantially equivalent to first conductive layer 20. Further, in the preferred embodiment, the width of isolation trench 25 is approximately 1 μm to minimize refill thickness. The width of the trench, however, can be substantially in the range of 0.2 μm to 4 μm. It should be noted that by this isolation trench arrangement, stress and defects can be drawn down to the interface between trench 25 and dielectric layer 15 of SOI substrate 10 to provide a means of intrinsic gettering of device regions 22 and 23.

Referring to FIG. 4, semiconductor structure 10 is depicted according to a fourth step of a first embodiment of the present invention. Upon completing the formation of trench 25, a polymer strip operation of the sidewalls, 27 and 28, of first and second conductive regions, 22 and 23, respectively, is initially performed.

Subsequently, a first silicon dioxide layer 30 is formed conformally with sidewalls 27 and 28, as well as superjacent a portion of the upper face of conductive regions, 22 and 23, to partially fill trench 25. In the preferred embodiment, first silicon dioxide layer 30 is thermally grown at a temperature substantially in the range of 850° C. to 900° C. in a dry ambient $O_2$. By doing so, first silicon dioxide layer 30 comprises a preferable thickness of approximately 400 Å. However, first silicon dioxide layer 30 can comprise a thickness substantially in the range of 300 Å, to 600 Å.

Referring to FIG. 5, semiconductor structure 10 is depicted according to a fifth step of a first embodiment of the present invention. Upon forming first silicon dioxide layer 30, a silicon dioxide refill 35 is formed to fill the remaining areas of trench 25. Refill 35 preferably comprises borophosphosilicate glass ("BPSG"), though an undoped silicon dioxide or a tetraethylorthosilicate ("TEOS") glass may also be employed.

Silicon dioxide refill 35 can be formed by various methods known in the ad. However, deposition techniques are preferred. In the event BPSG is selected, a reflow of silicon dioxide refill 35 can be performed at a temperature of approximately 850° C. for approximately 30 minutes to improve the planarity of refill 35 over the trench 25.

Figure 6:
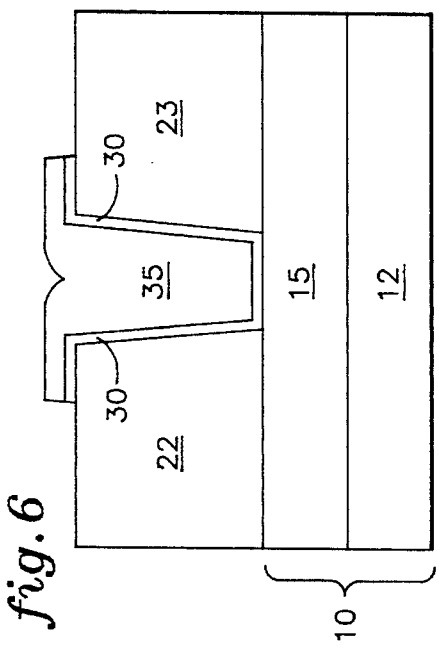
FIG. 6 illustrates a semiconductor structure according to a sixth step of a first embodiment of the present invention.

Referring to FIG. 6, semiconductor structure 10 is depicted according to a sixth step of the first embodiment of the present invention. Upon refilling trench 25 with silicon dioxide refill 35, an isolation mask (not shown) is applied topographically. Once an isolation mask is applied, the active area openings within the structure are etched down to conductive regions 22 and 23, as shown in FIG. 6. Completed bipolar devices can then be realized by performing subsequent known fabrication steps.

Several advantages and disadvantages should become apparent to one of ordinary skill in the art upon the completion of the processing steps of this embodiment. As the trench isolation silicon dioxide refill 35 comprises a low dielectric constant, a low parasitic capacitance can be achieved. However, silicon dioxide refills have stress related problems due to different rates of thermal expansion of silicon and silicon dioxide. Moreover, silicon dioxide may have gaps, distortions and other stress related problems because its deposition is not sufficiently conformal. Further, silicon dioxide is inherently a good insulator. As such, silicon dioxide has a substantially high resistive characteristic for parasitic purposes.

Figure 7:
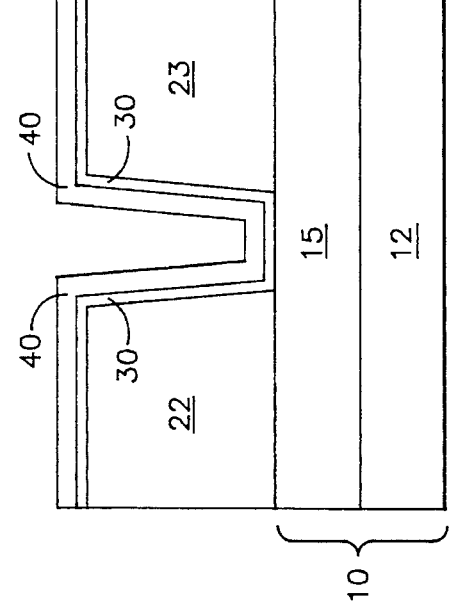
FIG. 7 illustrates a semiconductor structure according to an alternate step of a second embodiment of the present invention.

Referring to FIG. 7, semiconductor structure 10 is depicted according to an alternate step for a second embodiment of the present invention. Here, a second silicon dioxide layer 40 is formed superjacent first silicon dioxide layer 30 in a substantially conformal manner to refill a portion of the trench 25. Second silicon dioxide layer 40 has a thickness substantially in the range of 3000 Å to 8000 Å.

Moreover, second silicon dioxide layer 40 preferably comprises borophosphosilicate glass (BPSG). Undoped silicon dioxide or a tetraethylorthosilicate ("TEOS") glass, however, may also be employed. Second silicon dioxide layer 40 can be formed by various methods known in the art. Nonetheless, deposition techniques are preferred.

Referring to FIG. 8, semiconductor structure 10 is depicted according to a further step of the second embodiment. Upon forming second silicon dioxide layer 40, the remaining void—approximately 4000 Å—in trench 25 is refilled with undoped polysilicon refill 45. Polysilicon refill 45 can be formed by various methods known in the art. However, deposition techniques are preferred.

Upon refilling trench 25 with polysilicon refill 45, excess polysilicon is etched by a planarization or an etch back step so as to planarize the surface of the trench 25 and refill 45 with surfaces of conductive regions 22 and 23.

Subsequently, a silicon dioxide cap 50 is formed over trench 25, and, more particularly, over polysilicon refill 45. The formation of silicon dioxide cap 50 can be realized by either a thermal growth or deposition step.

Figure 9:
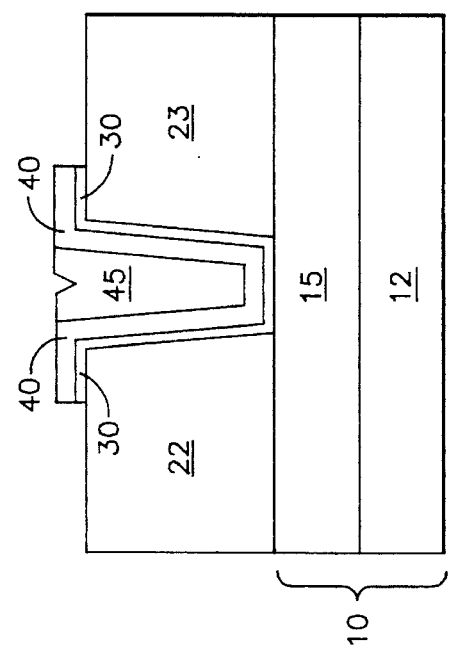
FIG. 9 illustrates a semiconductor structure according to a further step of the second embodiment of the present invention.

Referring to FIG. 9, semiconductor structure 10 is depicted according to a further step of the second embodiment. Once trench 25 is filled with undoped polysilicon filling 45, an isolation mask (not shown) is applied topographically. Upon the application of an isolation mask, the active area openings within the structure are etched down to conductive regions 22 and 23 as shown in FIG. 9. Subsequently, completed bipolar devices may then be realized by performing subsequent known fabrication steps.

Several advantages and disadvantages should also become apparent to one of ordinary skill in the art upon completing the processing steps of this embodiment. Employing solely an undoped polysilicon refill reduces stress related problems particularly at mask edges and corners because of the similar rates of thermal expansion between polysilicon and the active silicon regions. Further, undoped polysilicon is more conductive than silicon dioxide, and as such, it has a substantially lower resistive characteristic for parasitic purposes. Moreover, undoped polysilicon is more substantially conformal than silicon dioxide. However, undoped polysilicon has a substantially high dielectric constant, and therefore creates a substantially high parasitic capacitance.

Figure 10:
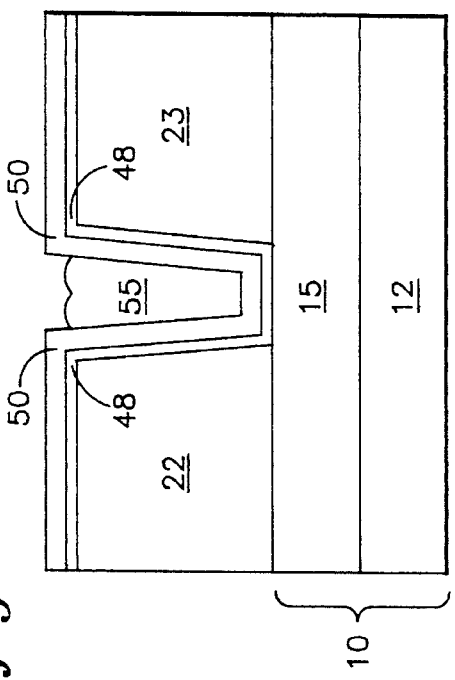
FIG. 10 illustrates a semiconductor structure according to an initial step of the preferred embodiment of the present invention.

Referring to FIG. 10, semiconductor structure 10 is depicted according to an initial step of the preferred embodiment of the present invention. Here, a trench is shown comprising a first silicon dioxide layer 48. Oxide layer 48 is preferably formed by a thermal growth step. Further, oxide layer 48 comprises a thickness of approximately 400 Å, though it can have a thickness substantially in the range of 300 Å to 600 Å.

Figure 11:
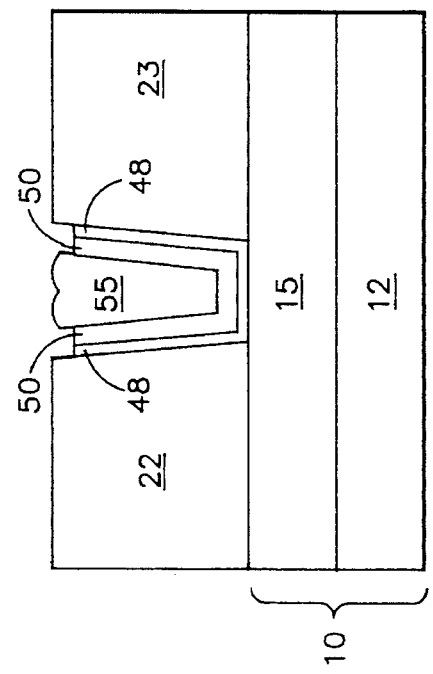
FIG. 11 illustrates a semiconductor structure according to a further step of the preferred embodiment.

Referring to FIG. 11, semiconductor structure 10 is depicted according to a further step of the preferred embodiment of the present invention. Upon forming oxide layer 48, a second silicon dioxide layer 50 is formed superjacent first silicon dioxide layer 48 in a substantially conformal manner to refill a portion of the trench. Further, second silicon dioxide layer 50 has a thickness of approximately 2000 Å.

Moreover, second silicon dioxide layer 40 preferably comprises borophosphosilicate glass (BPSG). However, undoped silicon dioxide or a tetraethylorthosilicate ("TEOS") glass may also be employed. Second silicon dioxide layer 40 can be formed by various methods known in the art, though deposition techniques, such as chemical vapor deposition, are preferred.

Figure 12:
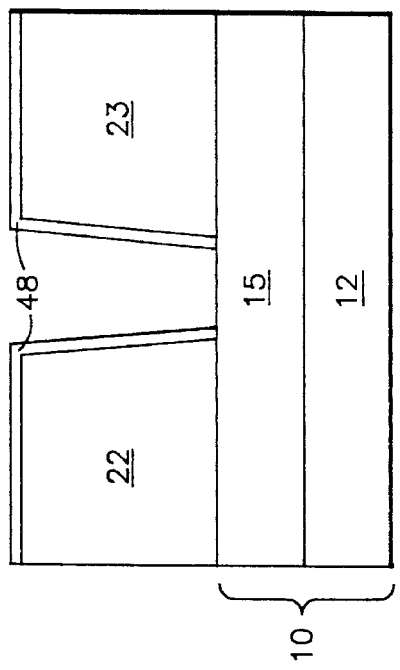
FIG. 12 illustrates a semiconductor structure according to a further step of the preferred embodiment.

Referring to FIG. 12, semiconductor structure 10 is depicted according to a further step of the preferred embodiment of the present invention. Once second silicon dioxide, layer 50 is formed, the remaining void of the trench is refilled with undoped polysilicon refill 55. Polysilicon refill 55 can be formed by various methods known in the art. However, deposition techniques are preferred. Subsequently, a polysilicon etch back step is performed to planarize the existing surface which results in the structural configuration of FIG. 12.

Figure 13:
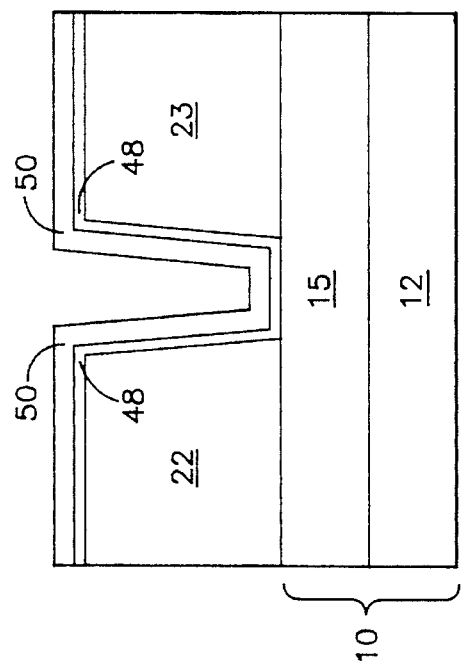
FIG. 13 illustrates a semiconductor structure according to a further step of the preferred embodiment.

Referring to FIG. 13, semiconductor structure 10 is depicted according to a further step of the preferred embodiment of the present invention. Here, an oxide hard mask strip step is performed, resulting in the crown of polysilicon refill 55 being exposed. By this same step, portions of oxide layers 48 and 50 between polysilicon refill 55 and conductive regions 22 and 23 are exposed as well.

Figure 14:
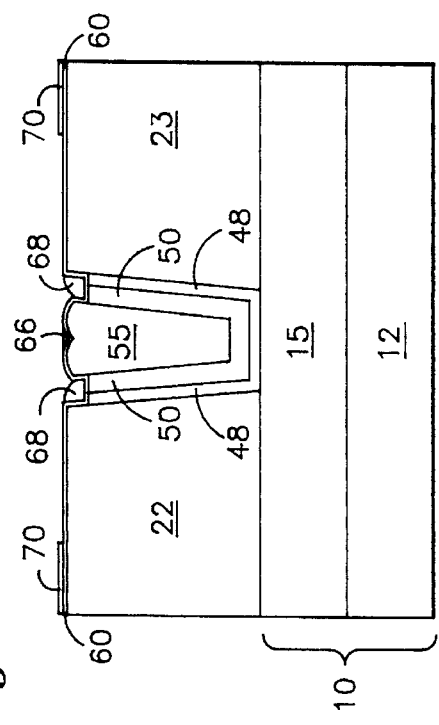
FIG. 14 illustrates a semiconductor structure according to a further step of the preferred embodiment.

Referring to FIG. 14, semiconductor structure 10 is depicted according to a further step of the preferred embodiment of the present invention. Upon etching down to conductive regions 22 and 23, the active area openings within the structure, a silicon dioxide pad 60 is formed superjacent trench refill 55. Silicon dioxide pad 60 is formed preferably by deposition, though other techniques may be employed. Silicon dioxide pad 60 also comprises a thickness of approximately 300 Å.

Subsequently, a layer of polysilicon 65 is formed superjacent silicon dioxide pad 60. Polysilicon layer 65 is formed preferably by deposition. However, other techniques may also be used. Further, polysilicon layer 65 comprises a thickness of approximately 2000 Å.

Figure 15:
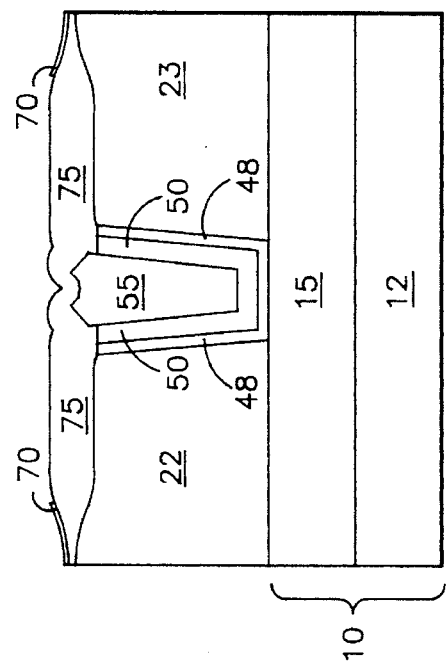
FIG. 15 illustrates a semiconductor structure according to a further step of the preferred embodiment.

Referring to FIG. 15, semiconductor structure 10 is depicted according to a further step of the preferred embodiment of the present invention. Here, an anisotropic etch step is performed. As a result of this step, a residual polysilicon portion 66 and a pair of polysilicon notches 68 remain positioned over silicon dioxide pad 60.

Figure 16:
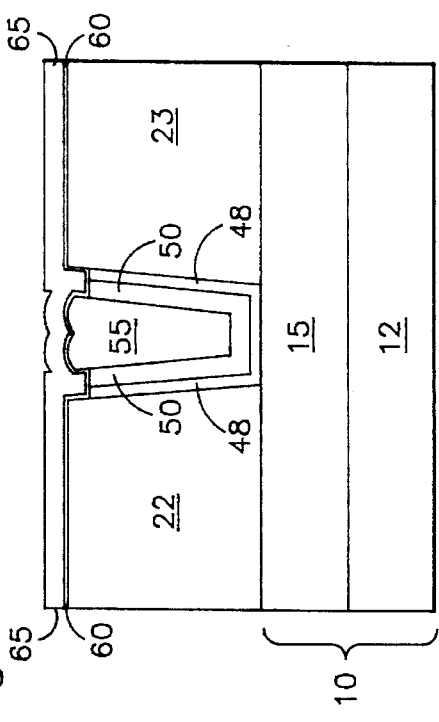
FIG. 16 illustrates a semiconductor structure according to a further step of the preferred embodiment.

Referring to FIG. 16, semiconductor structure 10 is depicted according to still a further step of the preferred embodiment of the present invention. Once the anisotropic etch step is performed, a silicon nitride layer 70 is formed, preferably by deposition, superjacent the silicon dioxide pad 60. Silicon nitride layer 70 is then masked, and the selected areas, particularly those over the top of trench 25, are etched off, as shown in FIG. 16.

Figure 17:
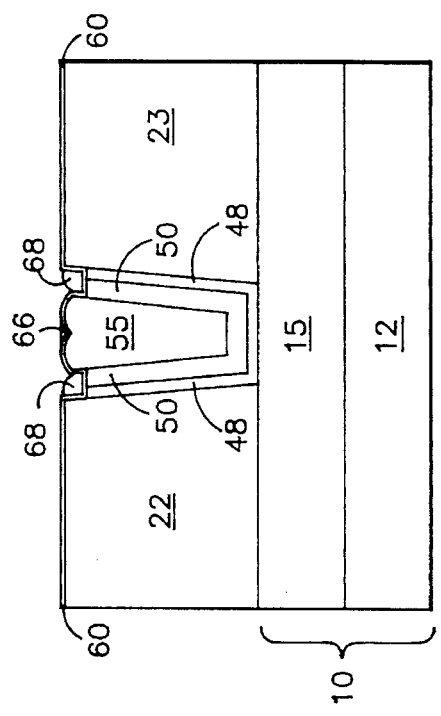
FIG. 17 illustrates a semiconductor structure according to a further step of the preferred embodiment of the present invention.

Referring to FIG. 17, semiconductor structure 10 is further depicted according to a final step of the preferred embodiment of the present invention. Here, a Local Oxidation of Silicon ("LOCOS") step is performed. As a result, both the residual polysilicon portion 66 and the pair of polysilicon notches 68 positioned over silicon dioxide pad 60 are converted to silicon dioxide, as is a portion of the trench refill 55. This LOCOS step also converts portions of conductive regions 22 and 23, under the nitride mask, from silicon to silicon dioxide. Thus, by performing a LOCOS step, a silicon dioxide cover 75 is formed superjacent the trench structure.

Moreover, by executing this LOCOS step, a "bird's beak" is created at both ends of the structure by stimulating silicon dioxide growth underneath both portions of silicon nitride layer 70. This result is significant in that silicon nitride is a brittle composition which generates defects under stress. However, by careful selection of the pad oxide and silicon nitride thicknesses, stresses may be minimized at or near the "bird's beak."

While the particular invention has been described with reference to illustrative embodiments, this description is not meant to be construed in a limiting sense. It is understood that although the present invention has been described in a preferred embodiment, various modifications of the illustrative embodiments, as well as additional embodiments of the invention, will be apparent to persons skilled in the art upon reference to this description without departing from the spirit of the invention, as recited in the claims appended hereto. Thus, for example, it should apparent to one of ordinary skill in that art that the preferred embodiment described herein can be employed in conjunction with either the first or second embodiments. It is therefore contemplated that the appended claims will cover any such modifications or embodiments as fall within the true scope of the invention.

All of the U.S. Patents cited herein are hereby incorporated by reference as if set forth in their entirety.

What is claimed is:

1. A method of making an isolation trench in a silicon on insulator ("SOI") substrate having an exposed dielectric layer, comprising the steps of:

forming a conductive layer superjacent the dielectric layer of the SOI substrate;

forming a trench through said conductive layer to expose a portion of the SOI dielectric layer, said trench having first and second sidewalls which separate said conductive layer into first and second conductive regions;

forming a first silicon dioxide layer conformally over said first and second sidewalls and over said exposed portion of the SOI dielectric layer;

refilling said trench with a refill comprising at least one of borophosphosilicate glass ("BPSG"), undoped silicon dioxide and tetraorthoethyloxide ("TEOS"); and reflowing said refill to improve the planarity of said refill over said trench.

2. The method of claim 1, wherein said step of reflowing comprises the step of:

heating said refill at a temperature of approximately 850° C. for approximately 30 minutes.

3. The method of claim 1, further comprising the step of:

forming a second silicon dioxide layer conformally over said first silicon dioxide layer.

4. The method of claim 3, wherein said second silicon dioxide layer formed comprises a thickness substantially in the range of 3000 Å and 8000 Å.

5. A method of fabricating an isolation trench in a silicon on insulator ("SOI") substrate having an exposed dielectric layer, comprising the steps of:

forming a conductive layer superjacent the dielectric layer of the SOI substrate, said conductive layer having an exposed major surface;

forming a trench through said conductive layer to expose a portion of the SOI dielectric layer, said trench having first and second sidewalls which separate said conductive layer into first and second conductive regions;

forming a first silicon dioxide layer conformally over said first and second sidewalls and over said exposed portion of the dielectric layer;

forming a second silicon dioxide layer conformally over said first silicon dioxide layer;

refilling said trench with a planarized non-conductive material;

stripping one portion of said first and said second silicon dioxide layers to expose a crown of said refilled trench and to expose another portion of said first and said second silicon dioxide layers in proximity to said crown;

forming a silicon dioxide pad superjacent said exposed crown and said exposed portions of said first and said second silicon dioxide layers, forming polysilicon deposits superjacent a portion of said silicon dioxide pad; and forming a silicon dioxide cover superjacent said refilled trench.

6. The method of claim 5, wherein said step of forming polysilicon deposits comprises the steps of:

forming a polysilicon layer superjacent said silicon dioxide pad; and removing a portion of said polysilicon layer such that said polysilicon deposits are formed.

7. The method of claim 5, wherein said step of forming said silicon dioxide cover comprises the step of:

oxidizing said polysilicon deposits and said silicon dioxide pad.

8. The method of claim 7, wherein said step of oxidizing comprises the steps of:

forming a silicon nitride layer superjacent said silicon dioxide pad;

removing portions of said silicon nitride layer in the vicinity of said trench to form first and second silicon nitride deposits on a respective one of said first and said second conductive regions; and growing a silicon dioxide formation underneath said first and second silicon nitride deposits.

9. The method of claim 5, wherein said second silicon dioxide layer comprises at least one of borophosphosilicate glass ("BPSG"), undoped silicon dioxide, and tetraethylothrosilicate ("TEOS").

10. The method of claim 5, wherein said planarized non-conductive material comprises undoped polysilicon.

* * * * *